United States Patent [19]
Sredanovic

[11] Patent Number: 5,959,899
[45] Date of Patent: Sep. 28, 1999

[54] SEMICONDUCTOR MEMORY HAVING SINGLE PATH DATA PIPELINE FOR CAS-LATENCY

[75] Inventor: Nikolas Sredanovic, Mountain View, Calif.

[73] Assignee: Mosel Vitelic Corporation, San Jose, Calif.

[21] Appl. No.: 09/139,538

[22] Filed: Aug. 25, 1998

[51] Int. Cl.$^6$ ...................................................... G11C 7/00
[52] U.S. Cl. ................................ 365/189.02; 365/230.02; 365/233
[58] Field of Search .............................. 365/189.02, 221, 365/230.02, 233

[56] References Cited

U.S. PATENT DOCUMENTS 5,877,990   3/1999   Kim ......................................... 365/221

Primary Examiner—Vu A. Le
Attorney, Agent, or Firm—Townsend and Townsend and Crew LLP; Henry K. Woodward

[57] ABSTRACT

In a semiconductor dynamic random access memory, a single path data pipeline for applying voltages from a sense amplifier to a data output pad for different column address signal (CAS) latencies comprising: a dual input single output latch, the dual inputs coupled to data bit (S1) and data bit bar ($\bar{S}1$) outputs of a sense amplifier and producing a single bit data output in response thereto, a buffer circuit coupled to the output latch and operable in response to enable signals (EN, $\bar{EN}$) for passing the data output from the latch, a dual input multiplexer (mux) with each input having a circuit for receiving the data output from the buffer circuit, one input circuit including a delay circuit for delaying application of the data output from the buffer circuit to the mux, the mux operable in response to a column address (CAS) latency signal to pass one of two signals, and logic gates coupled to pass the mux output to control the application of a voltage to a data output pad.

13 Claims, 3 Drawing Sheets

SEMICONDUCTOR MEMORY HAVING SINGLE PATH DATA PIPELINE FOR CAS-LATENCY

BACKGROUND OF THE INVENTION

This invention relates generally to semiconductor memories such as dynamic random access memories (DRAMs), and more particularly the invention relates to a semiconductor memory including a single path data pipeline to accommodate column address signal (CAS) latency.

Semiconductor memories such as DRAMs and SRAMs are becoming more compact with increased circuit density. This has allowed the operating speed or clock frequency to increase. Thus, semiconductor memories are generally operable over a wide operating frequency range. However, a fixed amount of delay is experienced in such circuits such as the precharging of sense amplifiers prior to accessing bit lines and the development of data bits (DB,$\overline{DB}$) on the sense amplifier output nodes and the transmission of the data bits to output pads. This can be due to column address latency or the time necessary in effecting an address to a column of the memory. Thus, some delay is required after a read command and the availability of data for the output pad to accommodate the CAS latency.

Heretofore, a first in/first out (FIFO) register has been employed to provide the required delay. Data is provided in parallel data paths with a circulating pointer sequentially selecting one of the data pads.

The present invention provides a simpler single path data pipeline to provide for variable CAS latency.

SUMMARY OF THE INVENTION

In accordance with the invention a semiconductor memory is provided with single path data pipelines for applying output voltages from bi-stable sense amplifiers to data output pads at an appropriate time in accordance with column address signal latency. Each pipeline includes a dual input and single output latch with dual inputs of each latch coupled to DB and $\overline{DB}$ outputs of a sense amplifier and producing a single bit data output in response thereto. A buffer circuit is coupled to the latch with each buffer circuit operable in response to enable signals (EN,$\overline{EN}$) to pass the data output from the latch. A multiplexer (mux) has two inputs each having a circuit for receiving the data output from a buffer circuit, one input circuit including a delay circuit for delaying application of the data output from a buffer circuit to the mux, the mux operable in response to a column address (CAS) latency signal to pass one of the two inputs in accordance with the specified CAS latency. Each mux output is connected through logic gates to control the application of voltages to a data output pad.

The invention and objects and features thereof will be more readily apparent from the following detailed description and appended claims when taken with the drawings.

DETAILED DESCRIPTION OF ILLUSTRATIVE EMBODIMENT

Figure 1:
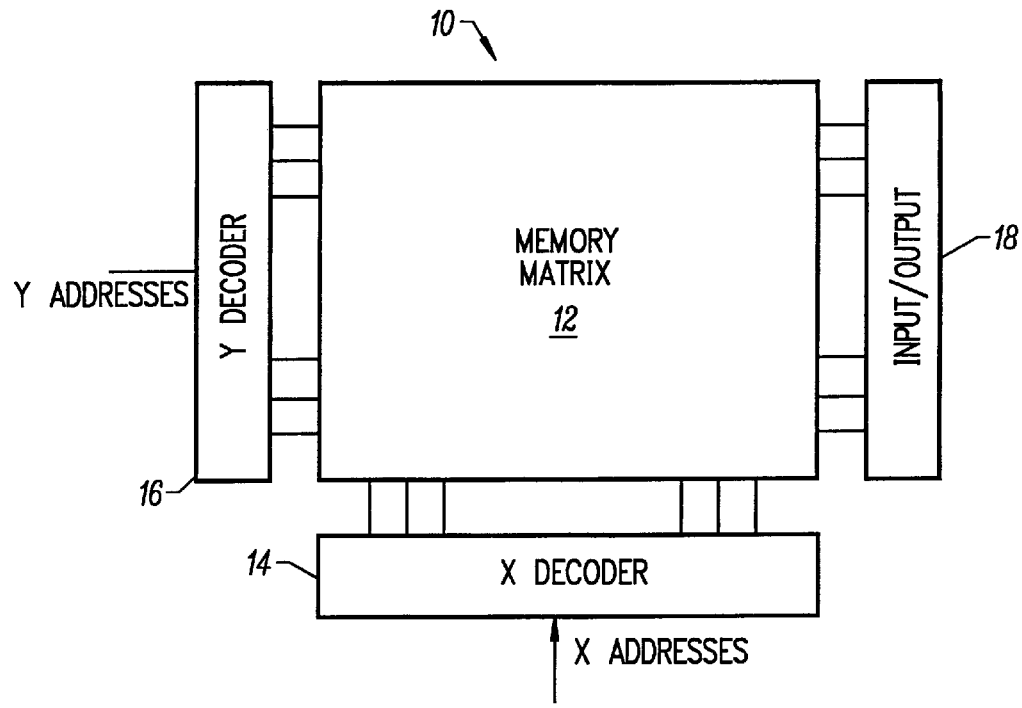
FIG. 1 is functional block diagram of a semiconductor memory.

FIG. 1 is a functional block diagram of a semiconductor memory 10 which includes a memory matrix 12 arranged in rows and columns with each column addressed by a Y decoder 14 in response to column address (CAS) and each row being addressed by an X decoder 16 in response to row address signals (RAS). Memory cells at crossing points of the columns and rows store charge which can be accessed by sense amplifiers which generate voltages for application to input/output pads 18.

The Y address signals typically follow the row address signals, and there is some latency in the development of voltages for application to the input/output pads following application of the Y address. The amount of latency depends in part on the operating frequency or clock rate of the memory. In accordance with the present invention, a single path data pipeline for applying voltages from a sense amplifier to a data output signal pad is provided for different column address signal (CAS) latencies.

Figure 2:
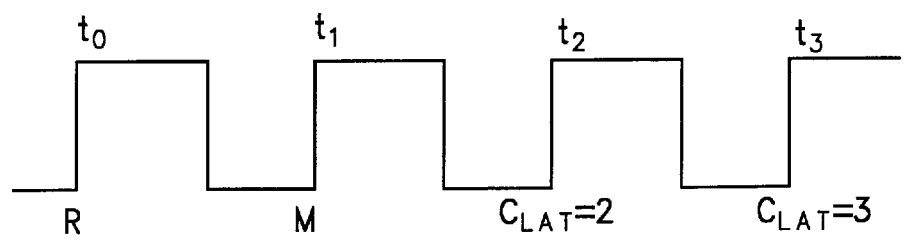
FIG. 2 is a timing diagram for operation of a single path data pipeline in accordance with one embodiment of the invention.

FIG. 2 illustrates a clock signal and time sequences in operating the single path data pipeline in accordance with an embodiment of the invention. At the rising edge of a clock at time $t_0$ a read signal R is generated. The first rising edge of the clock signal following $t_0$ is labelled $t_1$ and a signal M is then generated which is used to enable a latch. Time $t_2$ is the rising edge of the second clock signal following $t_0$ and defines the time period for CAS latency=2; and $t_3$ is the third rising edge of the clock signal after $t_0$ and defines the time period for CAS latency=3 time period.

Figure 3:
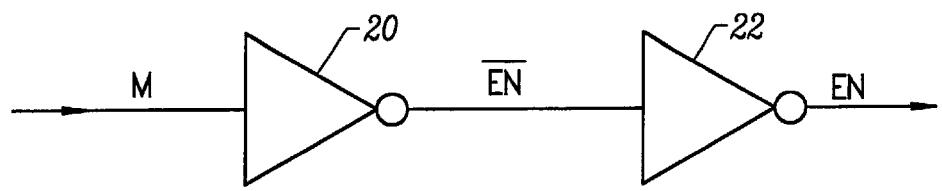
FIG. 3 is a schematic of a circuit for generating enable (EN) signals.

FIG. 3 is a circuit for generating enable (EN) and enable bar ($\overline{EN}$) from the M signal in FIG. 2. Enable bar is generated by inverting the multiplex M signal using inverter 20 and enable is generated by a second inverter 22 from enable bar.

Figure 4:
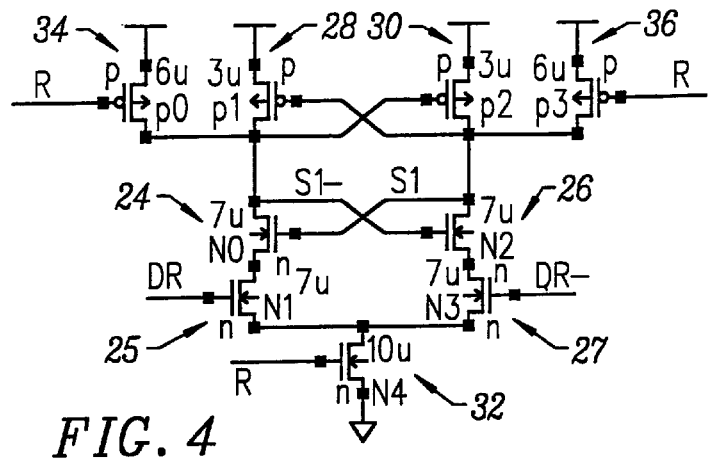
FIG. 4 is a schematic of a sense amplifier as used in a semiconductor DRAM memory.

Referring now to FIG. 4, a conventional sense amplifier for sensing data bits in bit lines (DB,$\overline{DB}$) is illustrated and includes cross-coupled transistors 24 and 26 which are serially connected between Vcc and circuit ground by transistors 28, 30, 32, 34 and 36. Transistors 34 and 36 are connected in parallel with transistors 28 and 30, respectively, and are activated by a read command, R, along with transistor 32. The DB and $\overline{DB}$ voltages from the bit lines are applied to the gates of transistors 25 and 27, and transistors 32, 34, and 36 apply Vcc and ground across the sense amplifier. The DB/$\overline{DB}$ charge separation forces a voltage unbalance of Vcc and ground at the output nodes S1, $\overline{S1}$ of the sense amplifier.

Figure 5:
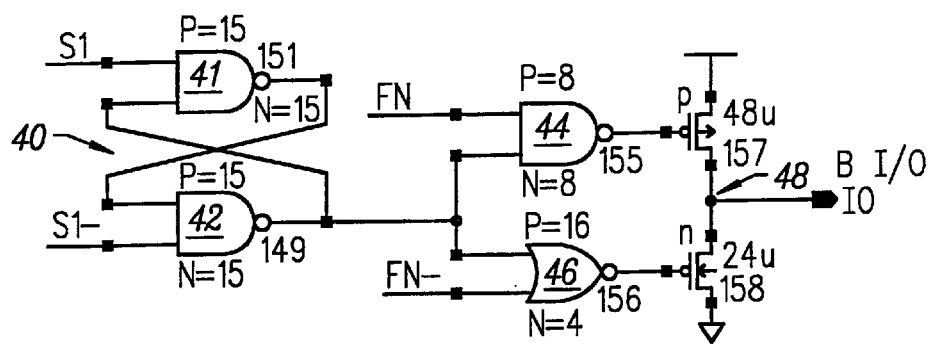
FIG. 5 is a schematic of one embodiment of a latch and buffer in accordance with the invention.

FIG. 5 is a schematic of a set/reset latch 40 having inputs coupled to the S1 and $\overline{S1}$ outputs of the sense amplifier in FIG. 4. The cross coupled NAND gates 41, 42 convert the two inputs to a single bit output where a one output corresponds to S1=1 and a zero output corresponds to S1=0. The output of latch 40 is then coupled to a buffer circuit comprising NAND gate 44 and NOR gate 46 which each receive the output of latch 40 and enable and enable bar signals as inputs. A tri-state buffer comprising CMOS transistor pair 48 is driven by the outputs of NAND 44 and NOR 46 to provide an output corresponding to the latch output.

Figure 6:
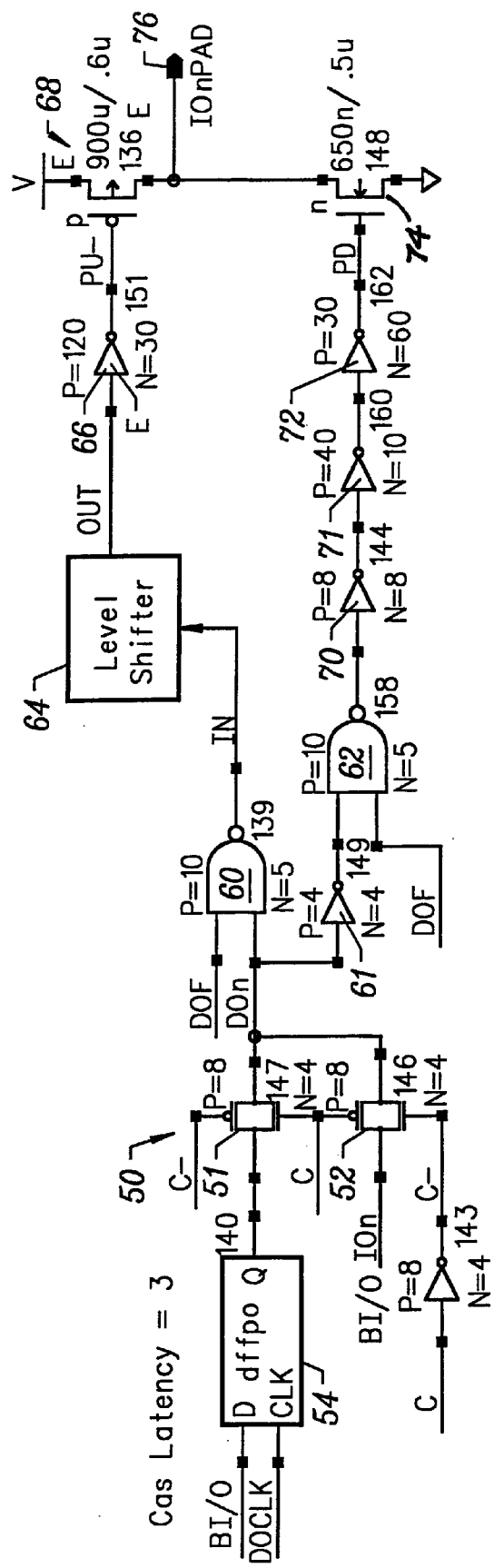
FIG. 6 is a schematic of a CAS latency controlled mux and logic circuitry for controlling the application of charge to a data output pad.

FIG. 6 is a schematic of a multiplexer shown generally at 50 which has two inputs for receiving the buffer output, (BI/O) and a data out clock (DOCLK). Mux 50 comprises a first CMOS pass gate 51 and a second CMOS pass gate 52 which respond to a CAS latency signal C to pass one or the other of the input signals. C=1 for CAS latency=3 and C=0 for CAS latency=2. One B I/O input to mux 50 passes through a differential flip flop delay 54 for CAS latency=3, and the other B I/O input passes directly to pass gate 52. Thus, for CAS latency=3 the delayed BI/O input from the delay 54 passes through pass gate 51 as an output, whereas for CAS latency=2 the B I/O signal passes directly through pass gate 52 as an output.

The output from mux 50 is then applied to NAND gate 60 and through inverter 61 to NAND gate 62. The other inputs to NAND gates 60, 62 are a data output enable signal, DOE. Conventionally, DOE is high when the chip is in read mode and is low at all other times to disable pad drivers 68 and 74. The output of NAND 60 is applied through a level shifter 64 and through driver 66 as a control signal for a pull-up transistor 68. The output of NAND 62 is passed through a series of inverters 70, 71, 72 to generate a control signal for pull-down transistor 74. The pull-up and pull-down signals toggle whereby either pull-up transistor 68 pulls the output pad 76 to the voltage level V or pull-down transistor 74 pulls down the output pad 76 to circuit ground. Use of level shifter 64 in the circuit of FIG. 6 is required when Vcc is a voltage less than the drive voltage for the output pad. For example, Vcc might be 2.5 volts while the drive voltage V is 3.0 volts.

Figure 7:
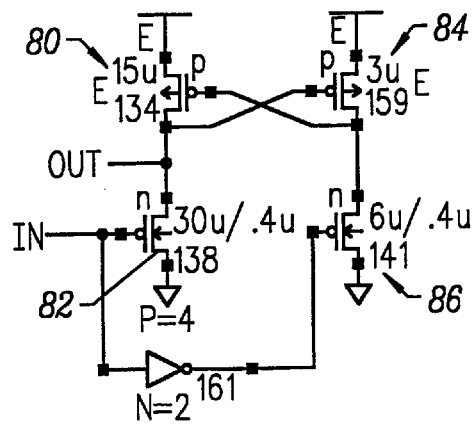
FIG. 7 is a schematic of a voltage level shifter which can be used in the circuit of FIG. 6.

FIG. 7 is one embodiment of a conventional circuit for providing the level shift. CMOS transistors 80, 82 are serially connected between the 3.0 voltage level and circuit ground and CMOS transistor pair 84, 86 are serially connected from the 3.0 voltage level and circuit ground. Output of NAND gate 60 of FIG. 6 is applied as an input to the gate of transistor 82 and as an inverted input to the gate of transistor 86. Transistors 80, 84 are cross-coupled to provide either a ground or a 3.0 voltage output in response to the input being a 1 or a 0, respectively.

The single bit data path pipeline as described accommodates different CAS latencies with circuitry that is less complicated than the use of FIFOs as in the prior art. While the invention has been described with reference to a specific embodiment, the description is illustrative of the invention and is not to be construed as limiting the invention. Various modifications and applications may occur to those skilled in the art without departing from the true spirit of the invention as defined by the appended claims.

What is claimed is:

1. A semiconductor memory comprising
    a matrix of memory cells arranged in addressable rows and columns,
    a plurality of sense amplifiers each connected to a row, each sense amplifier having a data bit (S1) output and a data bit bar (S2) output,
    a plurality of dual input and single output latches with the dual inputs of each latch coupled to S1 and S2 outputs of a sense amplifier and producing a single bit data output in response thereto,
    a plurality of buffer circuits with each buffer circuit coupled to an output latch and operable in response to enable signals (EN, EN) to pass the data output from the latch,
    a plurality of multiplexers (mux) with each mux having two inputs with each input having a circuit for receiving the data output from a buffer circuit, one input circuit including a delay circuit for delaying application of the data output from a buffer circuit to the mux, the mux operable in response to a column address (CAS) latency signal to pass one of the two inputs, and
    each mux output being coupled through logic gates to control the application of a voltage to a data output pad.

2. The semiconductor circuit as defined by claim 1 wherein each sense amplifier comprises a cross-coupled flip flop.

3. The semiconductor memory as defined by claim 1 wherein each dual input and single input latch comprises cross-coupled NAND gates with each gate receiving an output from a bi-stable sense amplifier.

4. The semiconductor memory as defined by claim 1 wherein each buffer circuit comprises a tri-state CMOS transistor pair which is driven by a NAND gate and a NOR gate in response to the latch output and enable signals.

5. The semiconductor memory as defined by claim 1 wherein each multiplexer comprises two CMOS pass gates which are selectively activated by latency signals to pass one of two inputs.

6. The semiconductor memory as defined by claim 1 wherein the logic gates control the conduction of a pull-up transistor and a pull-down transistor for charging or discharging a data output pad.

7. A semiconductor memory as defined by claim 1 wherein
    each bi-stable sense amplifier comprises a cross-coupled flip flop,
    each dual input and single input latch comprises cross-coupled NAND gates with each gate receiving an output from a bi-stable sense amplifier,
    each buffer circuit comprises a tri-state CMOS transistor pair which are driven by a NAND gate and a NOR gate in response to the latch output and enable signals,
    each multiplexer comprises two CMOS pass gates which are selectively activated by latency signals to pass one of two inputs, and
    the logic gates control the conduction of a pull-up transistor and a pull-down transistor for charging or discharging a data output pad.

8. In a semiconductor dynamic random access memory, a single path data pipeline for applying voltages from a sense amplifier to a data output pad for different column address signal (CAS) latencies comprising:
    a dual input single output latch, the dual inputs coupled to data bit (S1) and data bit bar (S2) outputs of a sense amplifier and producing a single bit data output in response thereto,
    a buffer circuit coupled to the output latch and operable in response to enable signals (EN, EN) for passing the data output from the latch,
    a dual input multiplexer (mux) with each input having a circuit for receiving the data output from the buffer circuit, one input circuit including a delay circuit for delaying application of the data output from the buffer circuit to the mux, the mux operable in response to a column address (CAS) latency signal to pass one of two signals, and
    logic gates coupled to pass the mux output to control the application of a voltage to a data output pad.

9. The single path data pipeline as defined by claim 8 wherein each dual input and single input latch comprises cross-coupled NAND gates with each gate receiving an output from a bi-stable sense amplifier.

10. The single path data pipeline as defined by claim 8 wherein each buffer circuit comprises a tri-state CMOS transistor pair which is driven by a NAND gate and a NOR gate in response to the latch output and enable signals.

11. The single path data pipeline as defined by claim 8 wherein each multiplexer comprises two CMOS pass gates which are selectively activated by latency signals to pass one of two outputs.

12. The single path data pipeline as defined by claim 1 wherein the logic gates control the conduction of a pull-up transistor and a pull-down transistor for charging or discharging a data output pad.

13. The single path data pipeline as defined by claim 8 wherein each bi-stable sense amplifier comprises a cross-coupled flip flop, each dual input and single input latch comprises cross-coupled NAND gates with each gate receiving an output from a bi-stable sense amplifier, each buffer circuit comprises a tri-state CMOS transistor pair which are driven by a NAND gate and a NOR gate in response to the latch output and enable signals, each multiplexer comprises two CMOS pass gates which are selectively activated by latency signals to pass one of two inputs, and the logic gates control the conduction of a pull-up transistor and a pull-down transistor for charging or discharging a data output pad.

* * * * *